United States Patent [19]

Medal

[11] Patent Number: 5,769,256
[45] Date of Patent: *Jun. 23, 1998

[54] METHOD AND APPARATUS FOR SECURING ONE PLASTIC MEMBER TO ANOTHER PLASTIC MEMBER

[75] Inventor: James Medal, Cape Coral, Fla.

[73] Assignee: Unimation, Inc., Ft. Meyers, Fla

[ * ] Notice: The term of this patent shall not extend beyond the expiration date of Pat. No. 5,222,850.

[21] Appl. No.: 650,988

[22] Filed: May 21, 1996

Related U.S. Application Data

[63] Continuation-in-part of Ser. No. 452,356, May 30, 1995, abandoned, which is a continuation-in-part of Ser. No. 84,699, Jun. 29, 1993, Pat. No. 5,391,031, which is a continuation-in-part of Ser. No. 887,722, May 22, 1992, Pat. No. 5,222,850.

[51] Int. Cl.⁶ .................................................. B65D 25/28
[52] U.S. Cl. ........................ 215/398; 220/770; 220/771; 264/445; 156/73.1; 156/580.1
[58] Field of Search .......................... 215/398; 220/770, 220/771; 29/525; 156/73.1, 580.2, 580.1; 264/445

[56] References Cited

U.S. PATENT DOCUMENTS

| | | | |
|---|---|---|---|
| 3,278,356 | 10/1966 | Katz | 156/294 |
| 3,819,437 | 6/1974 | Paine | 156/73 |
| 4,169,751 | 10/1979 | Yen | 156/73.1 |
| 4,211,923 | 7/1980 | Fukuyama et al. | 250/239 |
| 4,230,757 | 10/1980 | Toner | 428/137 |
| 4,293,359 | 10/1981 | Jakobsen | 156/156 |
| 4,326,902 | 4/1982 | Peddie | 156/73.1 |
| 4,368,826 | 1/1983 | Thompson | 215/100 A |
| 4,372,454 | 2/1983 | Thompson | 215/398 |
| 4,564,932 | 1/1986 | Langé | 369/286 |
| 4,618,516 | 10/1986 | Sager | 428/35 |
| 4,767,492 | 8/1988 | Fukusima et al. | 156/580.2 |
| 4,834,819 | 5/1989 | Todo et al. | 156/73.1 |
| 4,931,114 | 6/1990 | Sliva | 156/73.1 |
| 5,040,357 | 8/1991 | Ingemann | 53/478 |
| 5,222,850 | 6/1993 | Medal | 411/82 |
| 5,269,917 | 12/1993 | Stankowski | 210/232 |
| 5,316,603 | 5/1994 | Akazawa et al. | 156/69 |
| 5,391,031 | 2/1995 | Medal | 411/82 |
| 5,401,342 | 3/1995 | Vincent et al. | 156/73.1 |
| 5,403,415 | 4/1995 | Schembri | 156/73.1 |
| 5,435,863 | 7/1995 | Frantz | 156/64 |
| 5,535,901 | 7/1996 | Ishii et al. | 215/396 |
| 5,622,579 | 4/1997 | Tobias | 156/580.1 X |

FOREIGN PATENT DOCUMENTS

| | | |
|---|---|---|
| 55-121024 | 9/1980 | Japan . |
| 2 088 986 | 10/1981 | United Kingdom . |

*Primary Examiner*—Stephen J. Castellano
*Attorney, Agent, or Firm*—Fitch, Even, Tabin & Flannery

[57] ABSTRACT

A hollow container is formed with a thin-walled, plastic body; and a discrete plastic handle is attached by ultrasonic energy to the plastic body. The handle has a pair of spaced bosses at each end of the handle with a central opening therein to receive an ultrasonic horn. A plurality of integral, energy-directing protrusions are spaced from one another on the bosses to be melted and mixed with the plastic of the container. The energy directors melt first and mix with the plastic of thin-walled bottle to provide a secure attachment. The preferred container and preferred handle are each made of PET plastic.

4 Claims, 7 Drawing Sheets

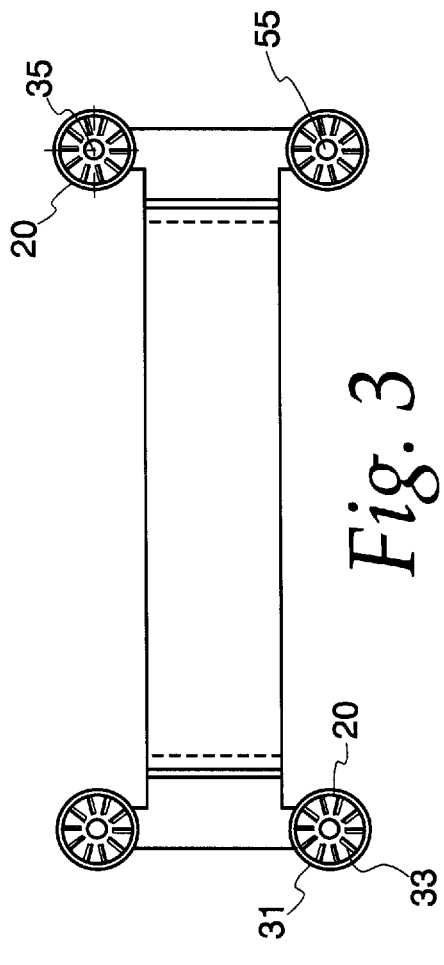
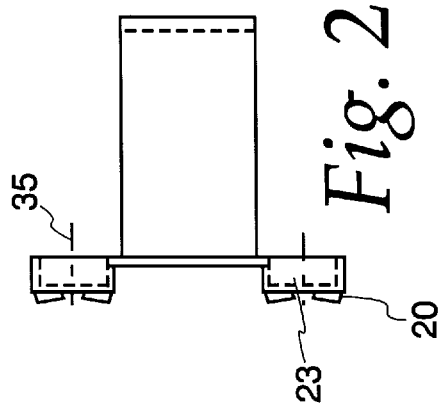
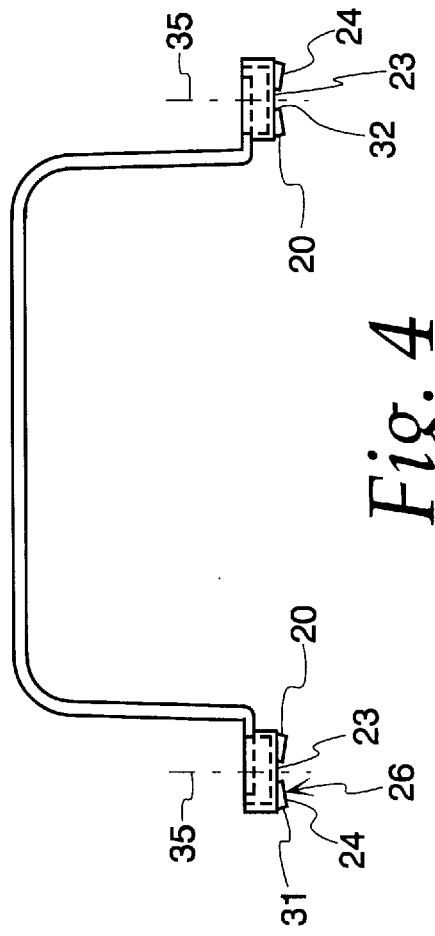

METHOD AND APPARATUS FOR SECURING ONE PLASTIC MEMBER TO ANOTHER PLASTIC MEMBER

FIELD OF THE INVENTION

This application is a Continuation-In-Part application of application Ser. No. 08/452,356 filed May 30, 1995, now abandoned, which is a Continuation-In-Part application of application Ser. No. 08/084,699 filed Jun. 29, 1993, now U.S. Pat. No. 5,391,031, which, in turn, is a Continuation-In-Part application of application Ser. No. 07/887,722 filed May 22, 1992, now U.S. Pat. No. 5,222,850.

BACKGROUND OF THE INVENTION

Molded plastic parts have becoming increasingly popular, due at least in significant part to their low production cost. Hence, often, one or more components of an assembly are formed of molded plastic. In assembling a final product it is often necessary to fasten the molded plastic parts to other components to produce the final product.

The present invention is of particular use to molders of plastic parts, such as molded plastic shells or bodies, who desire to attach another plastic member to the body and/or to assemblers who desire to attach a first plastic material member to a second plastic material member. The present invention will be described in connection with an illustrated embodiment wherein a hollow, plastic container e.g., made of polyethylene terephthalate (PET) plastic has a thin wall to which it is desired to secure a separate handle e.g., of PET or of a polycarbonate plastic in the shape of a loop, but is not limited to these examples. When lifting or pouring liquid from the container, the user may insert his fingers into the loop and grip the outer portion of the loop. When making such containers it may be desirable to be able to use handles of a different thickness or a shape that would be difficult to mold integrally with the container or of a different material than the container material. Some plastics such as PET are most desirable for containers, such as bottles or drinking cups, because of its clarity, crystalline appearance, toughness, etc.; but PET may be a difficult material to which to attach handles when using conventional attaching techniques. The present invention is not limited to PET material because for many other plastic objects, such as for the PET container piece, it is desired to provide a good attachment between the first plastic piece and a second plastic piece such as a handle. While ultrasonic welding of plastic pieces together is well known, the piece shapes are not specifically designed to direct or concentrate the ultrasonic energy to achieve the initial energy direction and concentration to cause a good integral band between the pieces. In these instances, one will find the PET plastic is usually not directly molded into its final shape by an injection molding as are many other containers such as, for example, polyethylene plastic containers. Rather, the PET plastic is first injection molded into a small preform which is then blown into the final enlarged container shape. With such preforms, often it is not economically feasible to have a handle thereon to be blown into a larger size or to attach a separate handle thereto using conventional techniques. Often for larger sizes of PET containers, e.g., a three liter container, it is desirable to attach a handle to this with plastic containers.

The present invention is also directed to applications where, heretofore, one or more plastic pieces have been secured together by metallic screws and it is desirable to eliminate the metallic screws and to secure the members together using an improved plastic fastening system. In other instances, pieces have been heat staked together and it is desired to replace heat staking of components together with a better plastic system than a heat staking system.

SUMMARY OF THE INVENTION

In accordance with the present invention, two plastic pieces are joined together by providing energy directing protrusions on a first plastic piece and exerting a force between the protrusions and the second plastic piece and applying ultrasonic energy which is directed to and concentrates at protrusions to create localized heat to melt them quickly. The plastic of the second piece in forced engagement with the melting protrusion also melts more quickly at the protrusion locations and intermixes with the protrusion plastic. The protrusions project from a face wall on the first piece and the face wall is also melted as is the plastic of the second piece engaged with the melting face wall of the first piece. Thus, the face wall is also melted and intermixed with the plastic of the second piece. The intermixed plastics are allowed to cool and become rigid and thereby integrally bond the first and second pieces together. Usually, the bond is made without the usual bulge or expanded weld area formed because of the pliable nature of the plastics being welded.

In the illustrated embodiment of the invention, the first piece is a container handle which has energy directing, spaced protrusions thereon, usually projecting from a face wall of a boss, having a boss wall. The boss and container outer wall are pushed together with force and ultrasonic energy is applied, and ultrasonic energy is directed to and concentrates the vibrations at the protrusions causing them to heat and to melt initially and causing the container plastic in contact with the protrusions to melt and to intermix with the protrusions. As the protrusions melt at spaced points, then the face wall of the boss moves into engagement with the container wall and the melted plastic face wall and the opposite abutted melted plastic of container flow together and intermix.

In accordance with another embodiment of the present invention, the preferred method provides a first plastic body or member with an opening therein; and inserting one end of a fastener boss into the opening and melting energy directors on the boss to mix with melted plastic from the body, defining the opening in body wall. This will secure the boss to the body and the boss will project outwardly from the plastic body. An elongated shank on a plastic fastener is inserted into a bore in the plastic boss; and energy directors on the fastener shank are melted and mixed with the plastic of the bore wall of the boss to secure the fastener to the boss. The fastener has its shank inserted through a hole in the second member; and an enlarged portion, such as a fastener head, abuts the second member on a side opposite the side opposite the side abutting the boss thereby securing the second member to the first plastic body. Often the first plastic member will be made of a first material and the second member will be made of material that is difficult to secure to the plastic body.

In the illustrated embodiment of the invention, a plastic container body will have a thin wall of 0.025 inches or less, and the boss projects outwardly from the plastic body and has a bore longer than the thickness of the body to give a longer fused attachment to the fastener. In this illustrated embodiment of the invention, the molded wall is a container body of a first material such as PET plastic, and the second member is either a handle of PET or a polycarbonate plastic that is attached by the plastic bosses and plastic fasteners to the container body wall. In this illustrated embodiment, the handle is a rigid loop having an inner handle attaching portion fastened by several bosses and fasteners at spaced locations on the container wall. An outer gripping portion of the handle is parallel to and spaced from the attaching portion to allow the user's fingers to be inserted into the space between gripping and attaching portions. In another illustrated embodiment, the handle is a thin, flexible web loop that has an upper neck portion attached to the container neck, and a lower portion connected by a boss and fastener, secured to a bottom end wall of the container in a recess in the bottom wall.

In each of these described embodiments of the invention, spaced protrusions on the boss integral on the first member, the discrete separate boss, or the fastener serve as energy directors or concentrators for ultrasonic energy applied thereto to cause the protrusions to melt quickly, and to fuse quickly into the surrounding melted plastic of the second plastic member. The preferred method involves the step of forcing the protrusions to have an interference fit with the surrounding plastic wall of the body and boss, respectively. The interference fit and energy director shape direct the ultrasonic energy to concentrate at the protrusions to heat and to melt them quickly for intermingling under pressure from the interference fit. The present invention is useful to secure members that are otherwise considered difficult to fuse to a plastic, such as a PET container and a polycarbonate handle.

BRIEF DESCRIPTION OF THE DRAWINGS

FIG. 2 is an end view of the handle shown in FIG. 1;

FIG. 3 is a front elevational view of the handle shown in FIG. 1;

FIG. 4 is a side elevational view of the handle shown in FIG. 1;

DETAILED DESCRIPTION OF THE PREFERRED EMBODIMENT

Figure 1:
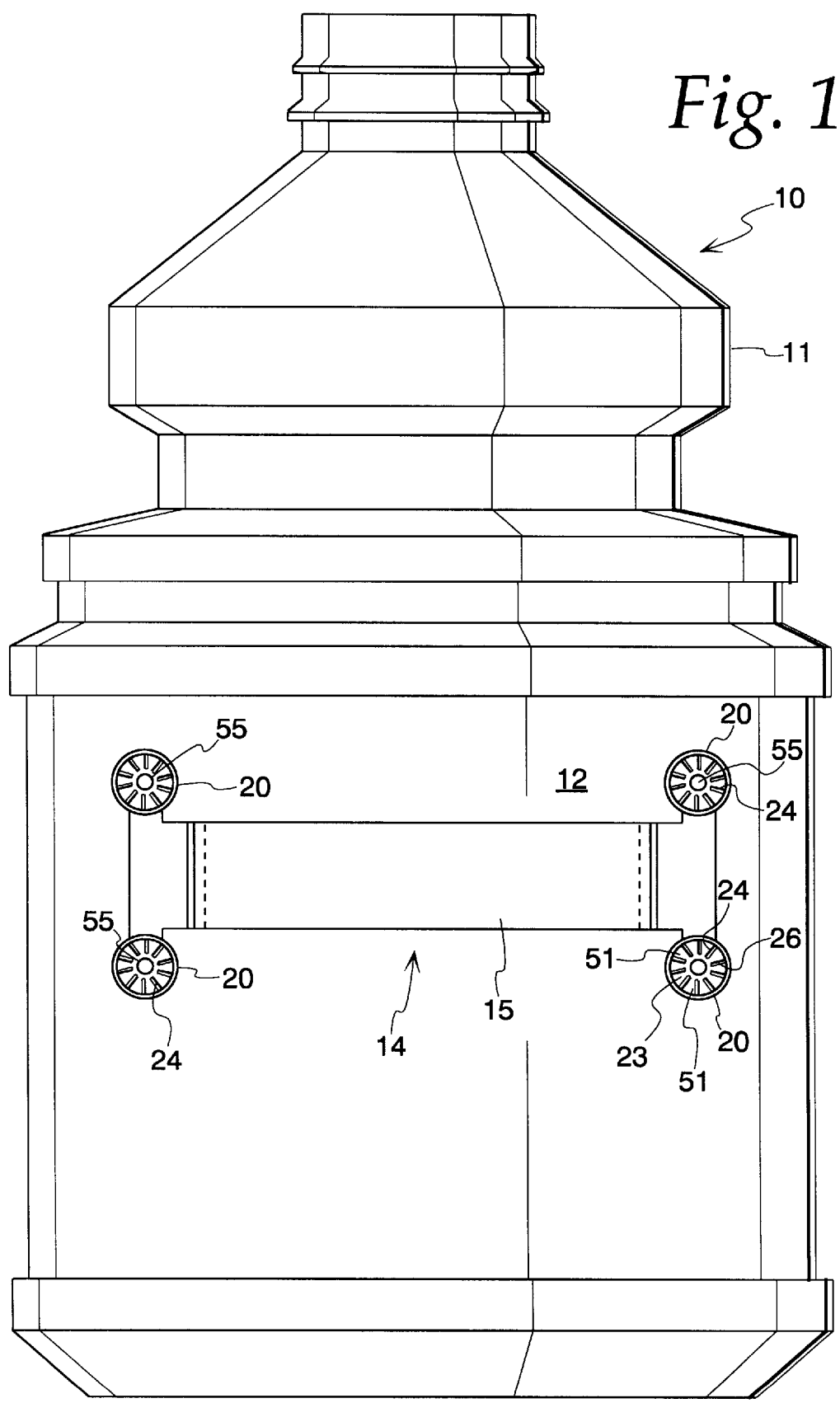
FIG. 1 is a front elevational view of a first plastic element, such as a container, having a second plastic element, such as a handle, secured by bosses and energy directors thereon in accordance with the preferred embodiment of the invention.
Figure 5:
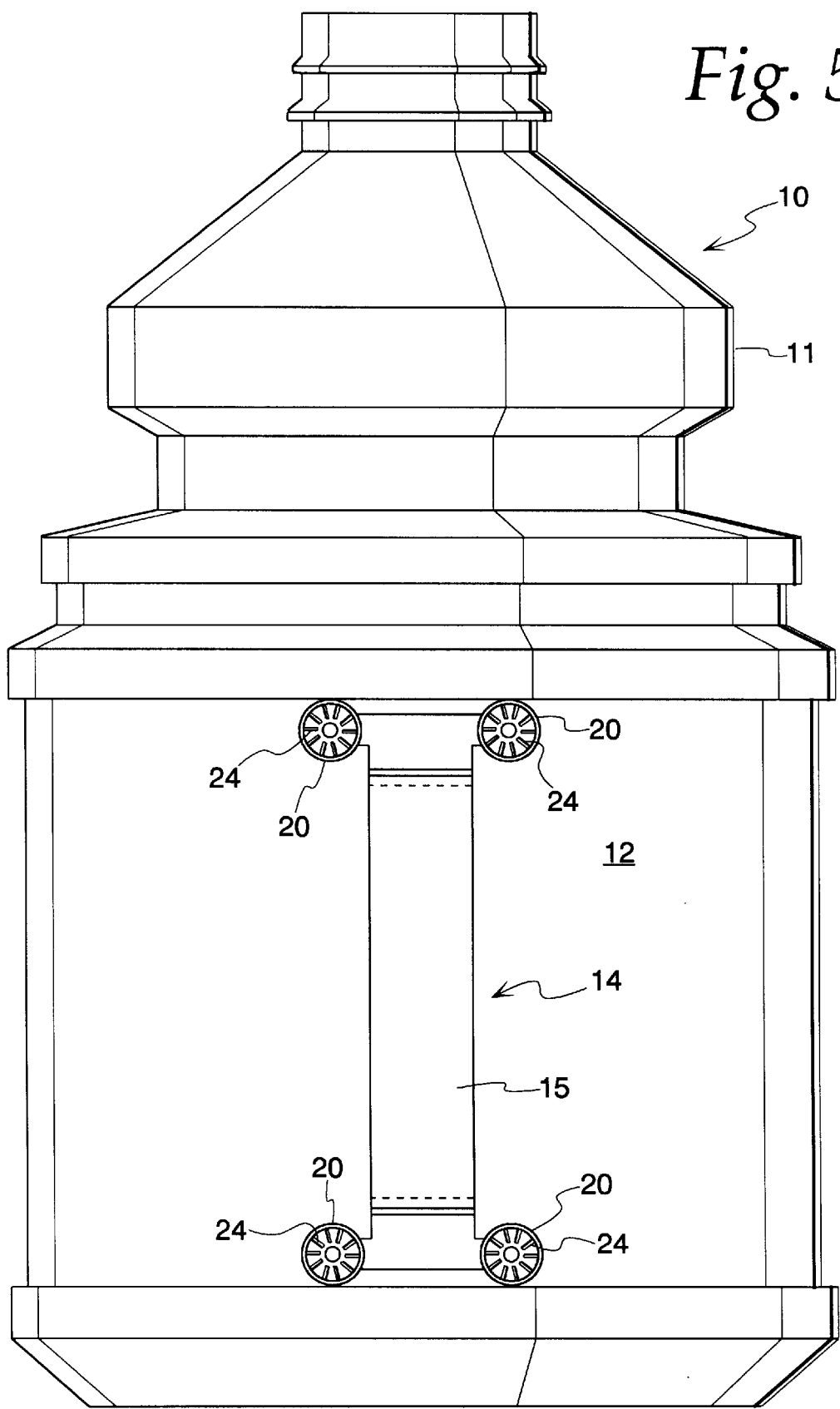
FIG. 5 is a view similar to FIG. 1, but with the handle oriented vertically instead of horizontally.
Figure 6:
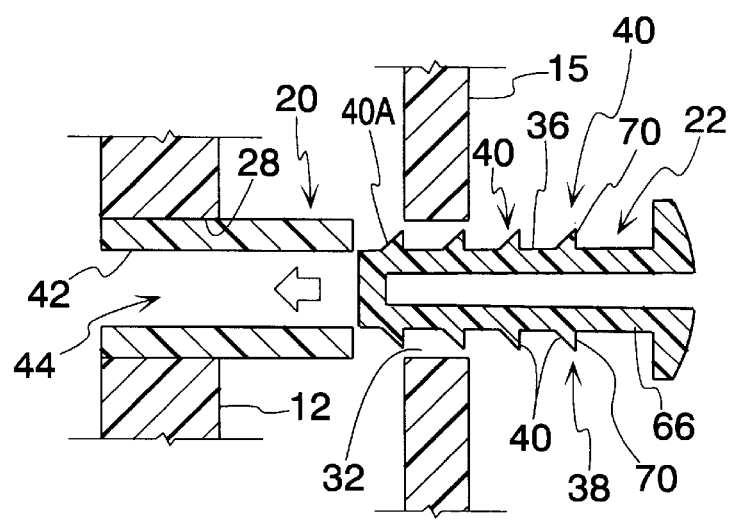
FIG. 6 illustrates another embodiment of the invention where a second member is being attached to a first member, to which is secured a boss to receive a plastic fastener, the boss and fastener having energy directors thereon.

As shown in the drawings, for purposes of illustration, the invention is embodied in a first plastic member 10, such as a container 11 having a thin wall 12 to which is attached a second member 14 (FIG. 1) such as a handle 15. Typically, the container wall has a thin cross-section, e.g., under 0.025 inch and is often made of a plastic that is difficult to fuse, such as PET, particularly in securing other plastic objects thereto. Often, the second member, such as the handle 15, are of a shape or a different material that cannot be integrally molded with the plastic body. In formation of PET containers, a small preform is injected molded and then the preform is blown to full, and it is desired to attach a full size handle to the full size container. In this illustrated embodiment of the invention, the container is made of a PET plastic and the handle is made of either PET or of polycarbonate material although other plastic materials may be used for the container and/or handle.

Figure 11:
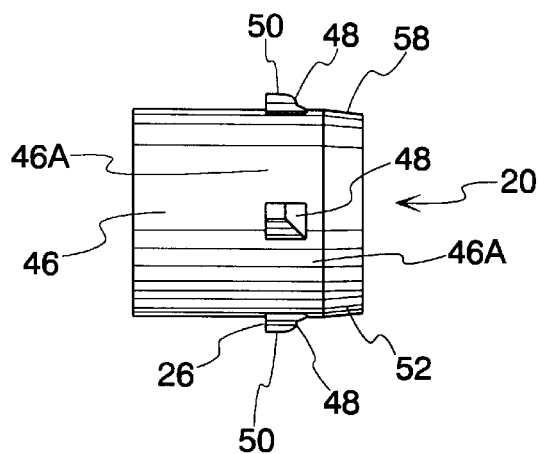
FIG. 11 is an enlarged view of a boss.
Figure 12:
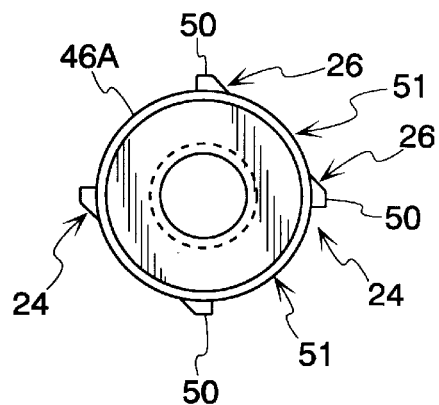
FIG. 12 is an enlarged view of an end of a boss.
Figure 13:
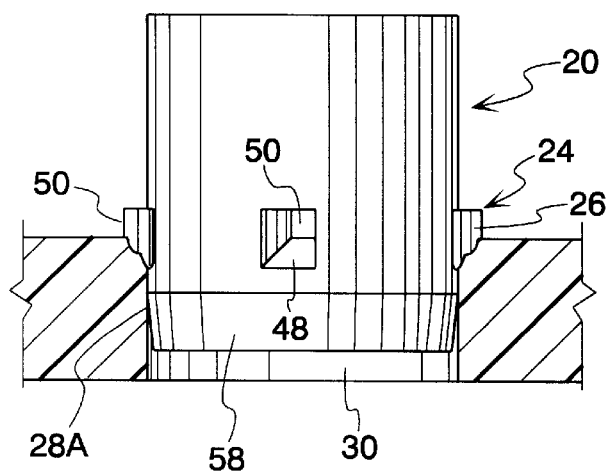
FIG. 13 shows a boss being connected to a container wall.
Figure 14:
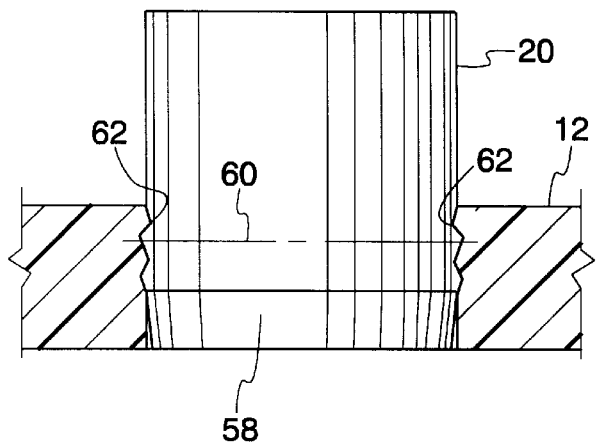
FIG. 14 shows the melding of the plastics from the energy directors and the wall of the container.

In accordance with the present invention, the first plastic body 10 and the second member 14 are provided with a plastic boss 20. The boss 20 has energy directors 24 in the shape of spaced protrusions 26 which are melted and mixed with plastic of the container wall 12 to form a good strong connection therewith. In the embodiments of FIGS. 1–5, a plurality of bosses 20 are integrally formed with the plastic handle with the energy directing protrusions 26 that project outwardly from a face wall 23. In the embodiments of FIGS. 6–14, the boss 20 is a separate, discrete piece, as best seen in FIGS. 11, 13 and 14 with boss protrusions 26 projecting outwardly from a face cylindrical wall 23 and abutted against a wall 28 (FIG. 7) defining an opening 30 in the container wall. In the FIG. 6–14 embodiments, the handle 15 has a hole 32 therein with an enlarged portion 34 of the fastener, such as a fastener head 35 abutting an outer side of the handle. A shank 36 on the fastener has energy directors 38 in the form of protrusions 40 thereon that are fused and mixed with plastic of a bore wall 12 in the boss in which wall 42 defines an elongated, hollow bore 44 therein. Thus, the shank of the fastener may be fused to the boss, which is fused to and projects outwardly from the container wall 12. In this embodiment of FIGS. 6–14, the bore and fastener have a fused length greater than the thickness of the container wall to give a good bonding surface area.

As disclosed in the aforesaid patent applications which are hereby incorporated by reference as if fully reproduced herein, the boss 20 (FIG. 6) may have a cylindrical body 46 with the boss protrusions 26) having slanted sidewalls 48 tapered in the direction of insertion so that the slanted sidewalls will slide along the container opening wall 28. The preferred fit is an interference fit with the outer diameter of the boss being equal to or greater than the diameter of the boss cylindrical body 46. In the embodiments of FIGS. 1–5, the face wall 23 of the boss 20 is a flat, circular wall with a plurality of radially extending protrusions 24, e.g., there being ten (10) protrusions shown in FIGS. 1 and 3. The protrusions are spaced to cover the entire bottom wall 23 of the boss so that the entire bottom wall will be attached to the container wall. The protrusions 24 project radially inwardly from an outer, circumferential wall 31 for the boss toward the center of the boss, and terminate at inner ends 33 spaced from a center axis 35 for the boss. Typically, the protrusions are quite small and pointed with a thicker base and a narrower outer side. The protrusions may be, for example, 0.375 inch in length; 0.016 inch in width; and 0.016–0.020 inch in height. A small diameter hole 55 is formed in the upper sides of the bosses to receive an ultrasonic horn therein.

The boss 20 will be forced under pressure against the container wall, and the protrusions may be deformed in the process. It has been found that the special protrusions 26 acts as energy directors for the ultrasonic energy to cause the ultrasonic energy emanating from the ultrasonic horn to flow along the protrusions to their outer ends with the vibrations concentrated thereat, e.g., the ultrasonic vibrations are concentrated at the pointed ends 50 (FIGS. 1 and 12). It appears that the energy directors first melt. That is, the ultrasonic energy is concentrate at the pointed ends of the protrusions and causes a quicker melting of the protrusions themselves and the abutted contiguous plastic of the container wall 12 first, before there is a melting of the portions 46a between the protrusions. The melted plastic from the protrusions flows sideways into spaces 51 between adjacent protrusions (FIGS. 1 and 12).

Figure 18:
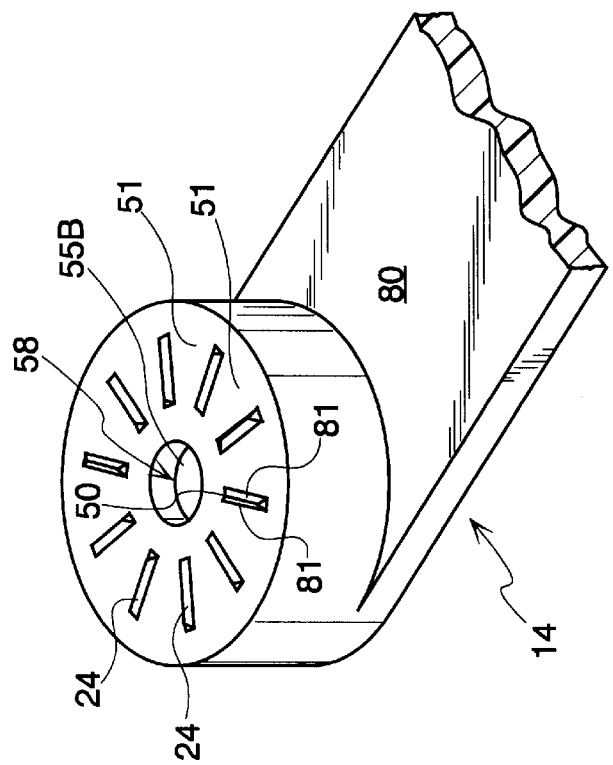
FIG. 18 is a bottom, perspective view of the second member and boss shown in FIG. 16.
Figure 16:
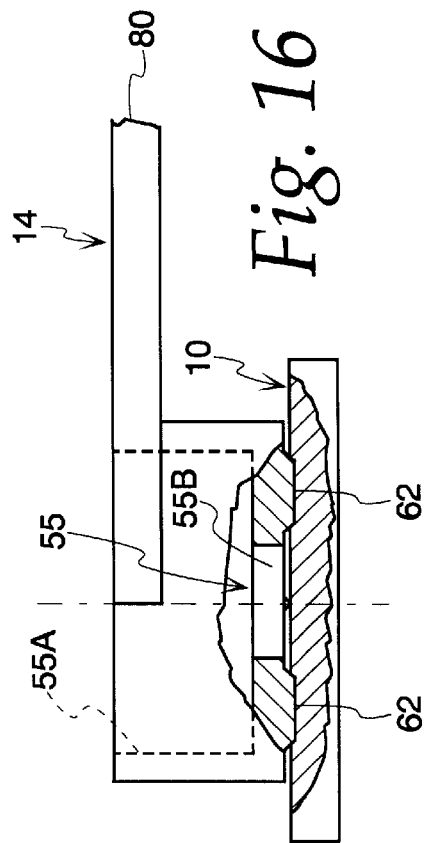
FIG. 16 illustrates a second member having an integral boss with energy directors attached to a first member.
Figure 17:
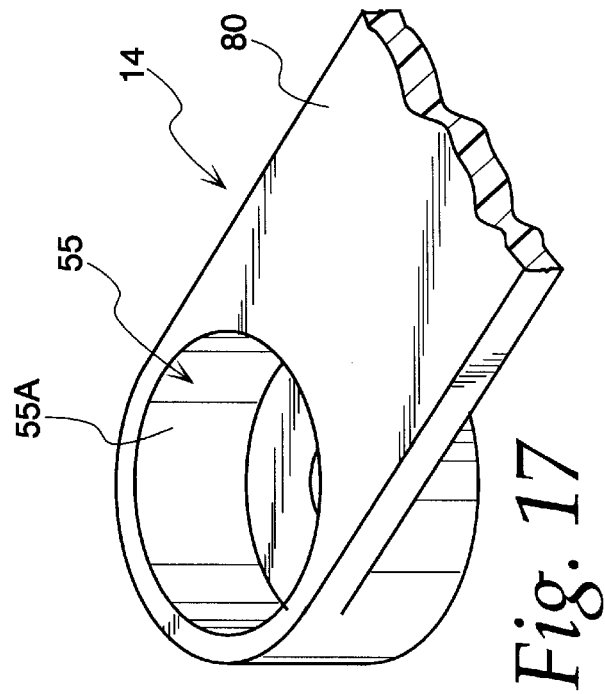
FIG. 17 is a perspective view of the second member and boss of FIG. 16.

A more generic form of boss 20 with energy directing protrusions 24 is shown in FIGS. 16–18, and this generic form of boss may be used on a portion 80 of any plastic second member 14. As more clearly seen in FIG. 18, the protrusions 24 may be formed with a triangular cross-section with long, sloped sidewalls 81 meeting at the sharp pointed end or edge 50. The spaces 51 between protrusions allow for the lateral flow of plastic as the protrusions are melted and form fused areas 62 of mixed plastic from the protrusions and the first plastic member 10. The boss 20 of FIGS. 16–18 is more hollow with a hole 55 having an enlarged diameter hole portion 55a and a connecting, smaller diameter portion 55b to receive an ultrasonic horn therein to melt the plastics of the respective first and second members 10 and 14. The outer cylindrical wall 31 of the boss can also be encircled by an ultrasonic horn; and the hole 55 need not be present in the boss 20. Thus, it will be seen that various plastic members 14 for any number of applications, in addition to the container application described herein, may be provided with an integral plastic piece or boss 20 with the energy directing protrusions 24 thereon, and be attached with a good, strong, complete area bond of invisible melded plastics to a first member 10.

Figure 7:
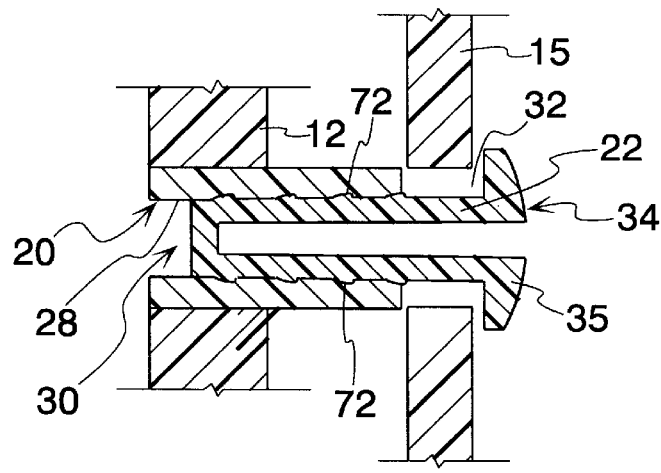
FIG. 7 shows the plastic fastener bonded to the boss, and the boss bonded to the first member.
Figure 8:
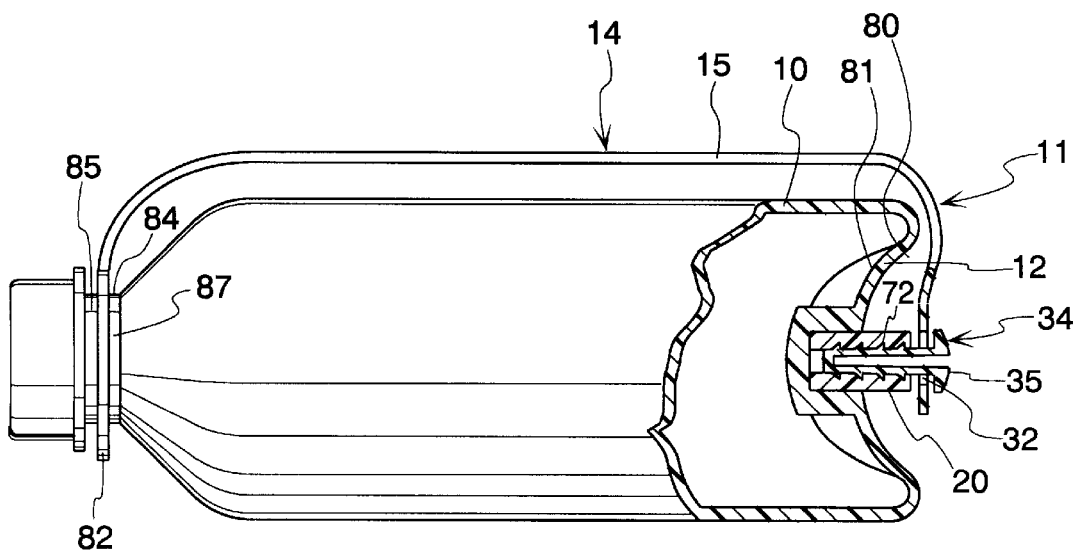
FIG. 8 illustrates the boss and fasteners of FIGS. 6 and 7 used to attach one end of a handle to a container.
Figure 9:
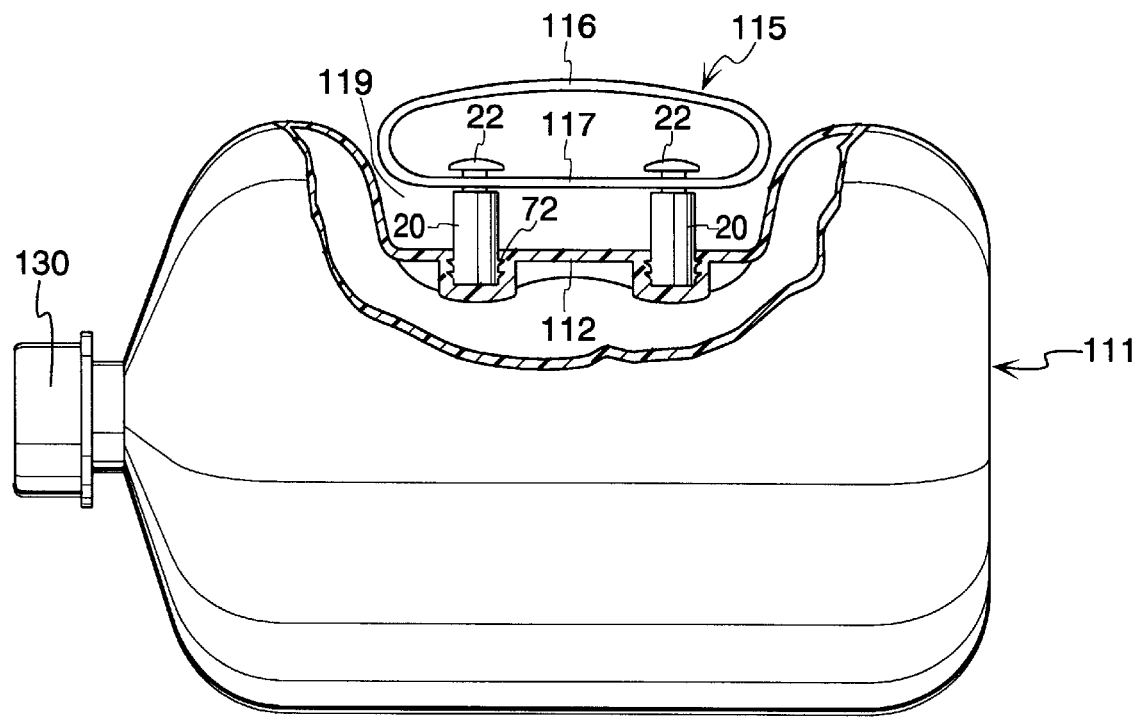
FIG. 9 illustrates another container with a handle attached by fasteners and bosses in accordance with the invention.

Turning now to the embodiment of FIGS. 6–14, to facilitate the insertion of the boss into the opening 30 in the container body wall 12, it is preferred to provide a chamfered end 58 on the boss. That is, the lower, leading end of the boss has a smaller diameter than the hole diameter to facilitate the starting of the boss insertion before the interference fit begins near the upper end of chamfered end 58. Usually, the boss will be made of a plastic material, the same as or close to the material of the body wall 12 to facilitate fusing and blending of the plastics into one another. Here, the container wall 12 is made of PET plastic and the boss is made of a plastic similar to the PET container wall 12. In other instances, bosses made of polycarbonate material have been fused to the PET wall. After melting of the engaged plastics of the boss and first member wall, the melted plastic is allowed to solidify and hence, the plastics are intermingled to form a melded, rigid plastic connection of great strength. When a cut is made through the cross-section along the line 60 (FIG. 9) through the location where the protrusions 26 were originally, one usually cannot locate where the protrusions were located. The protrusions are melted and mixed so well that they no longer could be found. As best seen in FIG. 9, there are rigid, fused areas 62 of combined plastics from the boss 20 and the first body wall 12 in a circular band. The fused plastic areas 62 provide a very strong connection between the boss and the container.

Figure 15:
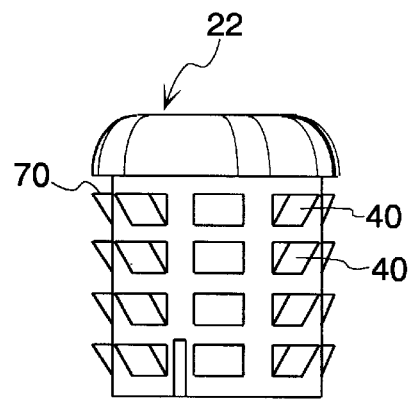
FIG. 15 illustrates a boss having a large number of energy directors thereon.

In a like manner, the fastener protrusions 40 have a slanted wall 40a to facilitate insertion of the fastener into the bore 44 of the boss. The outer diameter of a cylindrical wall 66 on the fastener is equal to or larger than the diameter of the bore wall 42 so as to provide an interference fit between the fastener and the bore wall 42 of the boss. When ultrasonic energy is applied to the fastener, the protrusions 40 serve to concentrate the ultrasonic energy at their outer pointed ends 70 which appear to melt first and more completely mix with the melted plastic of the bore wall 42 of the boss. The protrusions 40 are spaced circumferentially about the circumference of the fastener as shown in FIG. 15. The plastic between protrusions also melts, intermingles and mixes and then is allowed to solidify into a solid fused area 72 (FIGS. 7 and 8).

Figure 10:
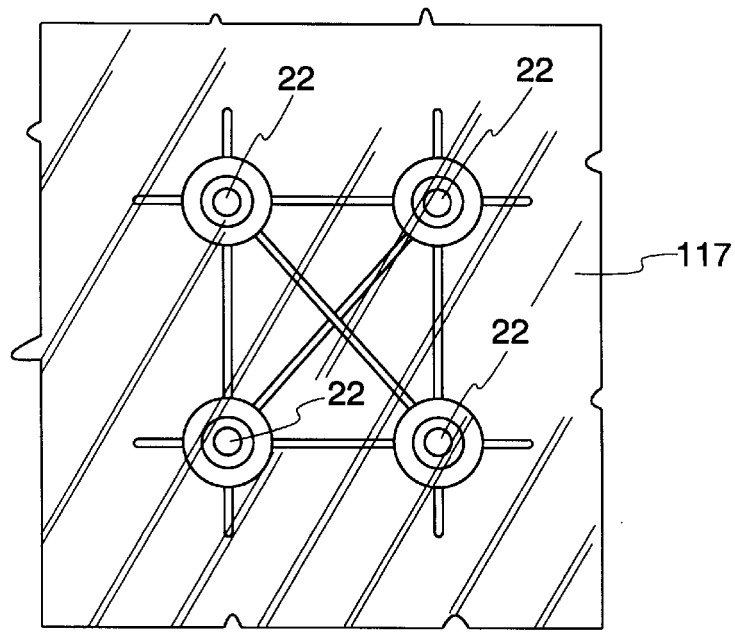
FIG. 10 is an enlarged view showing a portion of the handle, shown in FIG. 9, attached by four bosses and four fasteners to the container.

Another container 111 is shown in FIGS. 9 and 10 as having a handle 115 in the form of a loop with an outer gripping portion 116 and inner attaching portion 117. The handle 115 can be made of PET plastic or it can be made of polycarbonate or other material. Preferably, the container is made of PET although it can be made of various plastics such as polyethylene, acrylics, polystyrene, etc. The illustrated container 111 has a central depression 119 therein with the handle attaching portion 117 being fastened by four fasteners 22 and four bosses 20 in the same manner as described above in connection with the container 11 of FIG. 8. As shown in FIG. 9, there are four spaced fasteners 22 and four bosses 20 to attach the handle portion 117 at four spaced locations to the adjacent container wall 112. The gripping handle 15 (FIG. 8) is attached at the bottom of the container within a recess 80 formed by a bottom recess wall 81 of the container body to allow the container to sit upright on the bottom wall. The upper end of the handle 15 has an integral end 82 which has an opening 84 therein smaller than the diameter of a shoulder ring 85. The handle may be of soft, flexible polycarbonate and the smaller diameter opening may be pulled over the shoulder 85 while stretching, and then allowed to return to its smaller diameter on the container neck 87. Thus, the upper end of the handle may be secured to the container neck. Because the handle 15 is of a soft, flexible and thin plastic material, it can be pushed against the sidewall of the container and not interfere with the packaging of adjacent containers. Likewise, the handle 116 can be made of a soft material, although it is preferred to be made of a rigid strap, plastic material and fitted into the central recess or depression 119, so as not to substantially interfere with i.e., increase the overall dimension. Particularly, for large containers, e.g., three or more liters, the rigid handle allows pouring from the container in a horizontal position when the cap 130 is removed.

From the foregoing, it will be seen that there is a new and improved method of fastening plastic members together using energy director protrusions on a boss. The ultrasonic energy from the ultrasonic horn concentrates the energy at the protrusions causing them to melt first. The space between protrusions allows the melted plastic of the protrusions to have a space in which to flow thereby eliminating the usual bulge or expansion one gets when abutting two smooth, plastic surfaces together. The protrusions usually are positioned to cover the area where the bond is to be made so that the bond may a complete one, e.g., around a 360° circumference for a circular area.

What is claimed is:

1. A container comprising:

a hollow container having a thin-walled plastic body;

a plastic handle for the container;

a plurality of integral, plastic bosses on the handle for attaching the handle to the container; and a plurality of integral, energy directing protrusions on the respective bosses being spaced and having received ultrasonic energy and been melted and mixed with container plastic and solidified to attach the handle to the container.

2. A container in accordance with claim 1 wherein the handle has a pair of spaced bosses at each end of the handle with the protrusions having been melted and mixed with the container plastic and solidified at locations to attach the handle to the container, the bosses having a central opening therein to receive an ultrasonic horn.

3. A container in accordance with claim 1 wherein the container is made of PET plastic.

4. A container in accordance with claim 3 wherein the handle is made of PET plastic.

* * * * *